H. JOHNSON 2,932,748

SEMICONDUCTOR DEVICES

Filed July 26, 1954

INVENTOR.
HARWICK JOHNSON
BY J. L. Whittaker
ATTORNEY

United States Patent Office 2,932,748

Patented Apr. 12, 1960

2,932,748

SEMICONDUCTOR DEVICES

Harwick Johnson, Princeton, N.J., assignor to Radio Corporation of America, a corporation of Delaware Application July 26, 1954, Serial No. 445,730

5 Claims. (Cl. 307—88.5)

Figure 1:
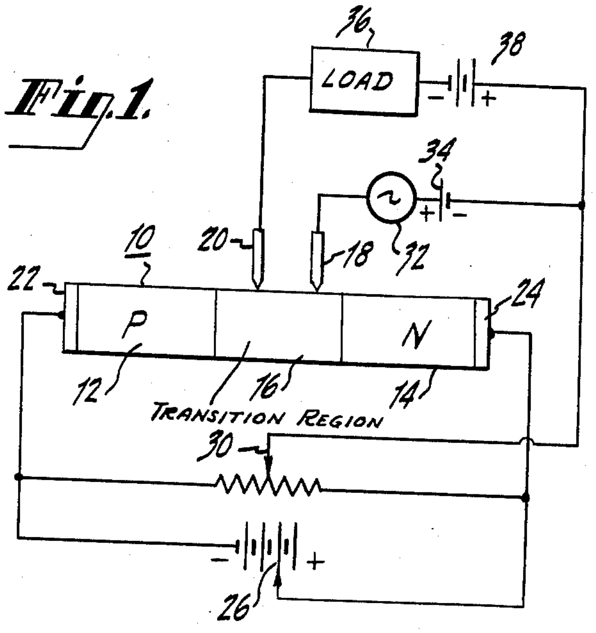

This invention relates to semiconductor devices and particularly to semiconductor devices suitable for high frequency operation.

One type of semiconductor device to which the principles of the invention apply is known as a transistor and one conventional type of transistor comprises a body of semiconductor material having two rectifying electrodes in contact therewith. The rectifying electrodes may be of the small area variety such as point or line contacts. The rectifying electrodes may also be of comparatively large area for example, plates or films in rectifying contact with the surface of the crystal or they may be P-N junction electrodes. In these types of transistors, one rectifying electrode is operated as an emitter electrode and injects minority charge carriers into the crystal. The minority charge carriers are collected by the other rectifying electrode which is termed the collector electrode. A base electrode is in ohmic (non-rectifying) contact with the crystal and, by determining the electric potential of the crystal, serves to control the emitter-to-collector current flow.

In typical transistor operation, the charge carriers which flow through the semiconductor body from the emitter to the collector proceed by a process of diffusion. By this process, the movement of the carriers is determined among other things by their innate mobilities and by their concentration gradient.

In flowing by the diffusion process, charge carriers injected by the emitter spread out from the emitter in all directions and, some charges are lost due to recombination. In addition, those charge carriers which do proceed to the collector follow transit paths of different lengths as a result of which they have different transit times. Thus, the high frequency operation of a transistor employing the diffusion process is limited.

Accordingly, an important object of this invention is to provide a semiconductor device of new and improved form.

Another object of this invention is to provide an improved semiconductor device providing improved high frequency operation.

In general the purposes and objects of this invention are accomplished in a semiconductor device by the provision of a semiconductor body or crystal having P-type and N-type zones or regions separated by a rectifying barrier or transition region of a thickness sufficient to allow the contact of at least two rectifying electrodes thereto. The rectifying electrodes in contact with the transition region are operated, one as the input or emitter electrode and the other as the output or collector electrode. A voltage source is connected across the semiconductor crystal and is oriented so that the P-type and N-type regions are biased in the reverse direction with respect to each other. Accordingly, the greater part of the voltage drop produced by the voltage source appears across the barrier or transition region and a comparatively strong electric field is present in said region. Thus, current flowing between the emitter and collector electrodes is affected by the comparatively intense electric field in the transition region and improved high frequency operation is achieved.

Figure 2:
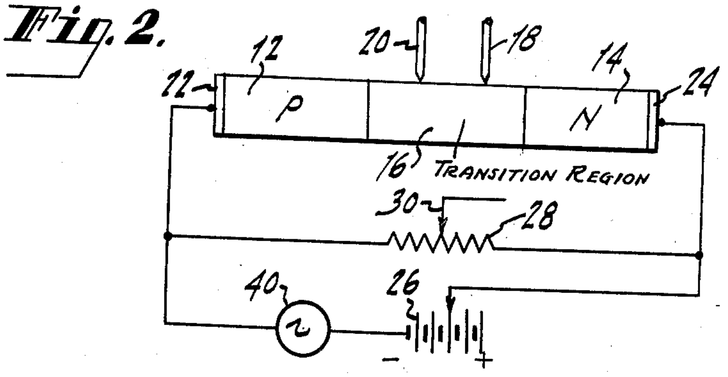

The invention is described in greater detail by reference to the drawing wherein:

Fig. 1 represents an elevational view of a semiconductor device embodying the principles of the invention and a schematic representation of an electrical circuit in which it may be operated; and, Fig. 2 is a schematic representation of a modification of a portion of the circuit of Fig. 1.

Similar elements are designated by similar reference characters throughout the drawing.

Referring to the drawing, a semiconductor device according to the invention comprises a semiconductor crystal or body 10 of germanium, silicon, or the like including a P-type conductivity region 12 and an N-type conductivity region 14 separated by a rectifying barrier or transition region 16. According to the invention, and as described in greater detail hereinafter, the barrier or transition region 16 has a thickness sufficient to allow contact thereto of one or more electrodes.

A pair of rectifying electrodes 18 and 20 are positioned on the semiconductor crystal in contact with the transition region. The type or types of rectifying electrodes employed in this invention is determined by the thickness of the barrier region. Under some circumstances, it may be preferable that the rectifying electrodes comprise small area electrodes of the point or line contact variety. However, if the thickness of the barrier region permits, comparatively large area rectifying films or plates or P-N junction electrodes may also be employed. If desired, a combination of these electrode types may be utilized. For the purposes of this description the rectifying electrodes 18 and 20 are shown as point contact electrodes which may be fine pointed wires of phosphor bronze, tungsten or the like.

An ohmic contact base electrode 22 is soldered or otherwise connected to the P-type region 12 and another ohmic contact base electrode 24 is similarly connected to the N-type region 14. An adjustable voltage source such as a battery 26 is connected between the base electrodes and is oriented with its negative terminal connected to the electrode 22 and its positive terminal connected to the electrode 24 so that the P-type and N-type regions are biased in the reverse direction with respect to each other. With this bias arrangement substantially the entire voltage drop across the crystal 10 due to the battery 26 appears across the barrier region 16 and a strong electric field exists across this region. A voltage divider comprising a resistor 28 having a slide contact 30 is connected across the battery.

When the device is connected in a circuit, the point contact electrode 18 is operated as an emitter electrode and is connected to a signal source 32 and to the positive terminal of a battery 34, the negative terminal of which is connected to the sliding contact 30. The sliding contact is positioned on the resistor 28 at a point which represents the reference voltage level for the emitter and collector electrodes of the device. The emitter electrode is thus biased in the forward direction with respect to the semiconductor crystal. The point contact electrode 20 is operated as the collector electrode of the device and is connected through a suitable load device 36 to the negative terminal of a battery 38, the positive terminal of which is connected to the sliding contact 30.

In operation of the device and circuit shown in Figure 1, the emitter electrode 18 injects minority charge carriers into the semiconductor crystal 10 under the control of a signal from the signal source 32. The charge carriers injected by the emitter flow to the collector electrode 20 under the influence of the electric field across the barrier region. Thus, charge carrier flow takes place not by diffusion but under the controlling force of the electric field. An output current appears in the collector load circuit in response to the injected emitter current. The frequency response of the device depends, among other things, on the voltage of the battery 26 and the electric field produced thereby in the transition region 16. As the electric field is varied by adjustment of the applied voltage, the drift of the charge carriers and the frequency response are correspondingly changed.

If desired, referring to Figure 2, a signal source 40 may be connected in circuit with the voltage source 26 to modulate the electric field in the transition region 16 and thereby provide further control of the emitter-to-collector current flow.

The semiconductor crystal including the P-type and N-type regions separated by the comparatively thick transition region may be prepared in many ways. According to one suitable method, a semiconductor crystal is grown from a melt of semiconductor material, e.g. germanium, said melt including quantities of two opposite types of impurity material, that is N-type and P-type inducing, having different segregation coefficients. For example, the germanium melt may include a quantity of gallium equal by weight to about 1 to 10 parts per million of the germanium and a quantity of antimony equal to about 50 times the amount of gallium. A seed crystal is lowered to contact the surface of the melt and is gradually withdrawn without agitation and, as the crystal grows, the melt is agitated.

During those periods when the melt is not agitated, the concentration of the impurity, i.e., antimony, having a very high ratio of solubility in the melt to solubility in the solid crystal, builds up rapidly at the liquid-solid interface. When the melt is agitated, the impurities are disposed more uniformly throughout the melt.

Due to the difference between the segregation coefficients of gallium and antimony, the portion of the crystal grown while the melt is agitated includes an excess of gallium impurity over antimony impurity and is P-type material. Conversely, the portion of the crystal grown while the melt is qiescent includes an excess of antimony impurity over gallium impurity and is N-type material. The boundary region between these two regions defines a P-N rectifying junction.

A P-N rectifying junction is thus formed in the crystal in close proximity to that part of the crystal lying at the liquid-solid interface at each time that the agitation is commenced and at each time that the agitation is stopped.

The thickness of a P-N rectifying junction produced by this method may also be readily controlled. In the case of a junction formed at the start of the agitation period, the thickness may be controlled by controlling the rate of agitation or the rate of increase of agitation. Vigorous agitation or a more rapid increase of agitation will produce a thinner, more sharply defined junction than mild agitation or agitation that is slowly increased. In the case of a junction formed at the start of the intervals between agitation periods, its thickness also may be controlled by the degree of agitation, or by a suitable selection of the impurity materials and their relative quantities in the melt. Vigorous agitation will tend to make these junctions thicker than does mild agitation, and the selection, according to segregation coefficient, of impurity materials such that the initially grown crystal bears a relatively large excess of one such material over the other will provide a relatively thick junction.

The principles of the present invention thus provide a device and method for overcoming the limitations of the charge carrier diffusion process which adversely affect the high frequency operation of conventional transistors. The particular device described herein has its charge carrier flow path concentrated in a P-N junction and having an intense electric field across the junction for aiding the charge carrier flow.

What is claimed is:

1. A semiconductor device comprising a body of semiconductor material having two regions of semiconductor material of opposite conductively types separated by a rectifying barrier region having a finite thickness, and a pair of rectifying electrodes in contact with said barrier region aligned along an axis in the direction of the thickness of said barrier region.

2. A semiconductor device comprising a body of semiconductor material having a region of N-type material and a region of P-type material separated by a transition region having a finite thickness, and a pair of rectifying electrodes in contact with said transition region aligned along an axis in the direction of the thickness of said transition region.

3. A semiconductor device comprising a body of semiconductor material having a region of N-type material and a region of P-type material separated by a transition region having a finite thickness, and a pair of rectifying electrodes in contact with said transition region aligned along an axis in the direction of the thickness of said transition region, and connection means for establishing an electric field across said body.

4. A semiconductor device comprising a body of semiconductor material having a region of N-type material and a region of P-type material separated by a transition region having a finite thickness, and a pair of rectifying electrodes in contact with said transition region aligned along an axis in the direction of the thickness of said transition region, and connection means for establishing an electric field across said body, said electric field being concentrated across said transition region.

5. A semiconductor device comprising a body of semiconductor material having a region of N-type material and a region of P-type material separated by a transition region having a finite thickness, a pair of rectifying electrodes in contact with said transition region aligned along an axis in the direction of the thickness of said transition region, and a non-rectifying electrode in ohmic contact with each of said P-type and N-type regions.

References Cited in the file of this patent

UNITED STATES PATENTS

| | | |
|---|---|---|
| 2,502,488 | Shockley | Apr. 4, 1950 |
| 2,561,411 | Pfann | July 24, 1951 |
| 2,570,978 | Pfann | Oct. 9, 1951 |
| 2,657,360 | Wallace | Oct. 27, 1953 |
| 2,695,930 | Wallace | Nov. 30, 1954 |
| 2,717,342 | Pfann | Sept. 6, 1955 |
| 2,763,731 | Pfann | Sept. 18, 1956 |
| 2,790,037 | Shockley | Apr. 23, 1957 |